United States Patent
Fukushima et al.

(10) Patent No.: US 6,555,594 B1
(45) Date of Patent: Apr. 29, 2003

(54) PHOTO-CURABLE ELECTRICALLY CONDUCTIVE COMPOSITION AND PLASMA DISPLAY PANEL HAVING ELECTRODES FORMED BY USE OF THE SAME

(75) Inventors: Kazunobu Fukushima, Saitama-ken (JP); Hiroyuki Tokai, Higashimatsuyama (JP); Kouichi Takagi, Kawagoe (JP); Tadashi Furuhashi, Shiki (JP)

(73) Assignee: Taiyo Ink Manufacturing Co., Ltd. (JP)

( * ) Notice: Subject to any disclaimer, the term of this patent is extended or adjusted under 35 U.S.C. 154(b) by 0 days.

(21) Appl. No.: 09/890,096

(22) PCT Filed: Jan. 21, 2000

(86) PCT No.: PCT/JP00/00297

§ 371 (c)(1), (2), (4) Date: Jul. 27, 2001

(87) PCT Pub. No.: WO00/45224

PCT Pub. Date: Aug. 3, 2000

(30) Foreign Application Priority Data

Jan. 29, 1999 (JP) .......................................... 11-021318

(51) Int. Cl.[7] .......................... G03F 7/027; G03F 7/004; H01J 9/02; H01J 11/02; C08L 101/00
(52) U.S. Cl. .......................... 522/81; 522/83; 524/403; 524/407; 524/413; 524/435; 315/169.3
(58) Field of Search ..................... 522/81, 83; 524/403, 524/407, 413, 435; 315/169.3

(56) References Cited

U.S. PATENT DOCUMENTS 5,851,732 A  12/1998  Kanda et al. ............... 430/321
6,103,452 A  * 8/2000  Kakinuma et al. ....... 430/270.1

FOREIGN PATENT DOCUMENTS

| JP | 4-290401   | 10/1992 |
| JP | 5-212833   | 8/1993  |
| JP | 8-217459   | 8/1996  |
| JP | 10-7982    | 1/1998  |
| JP | 10-39503   | 2/1998  |
| JP | 10-333322  | 12/1998 |
| JP | 11-194493  | 7/1999  |

* cited by examiner

Primary Examiner—Nathan M. Nutter
(74) Attorney, Agent, or Firm—Rader, Fishman & Grauer PLLC; Ronald P. Kananen, Esq.

(57) ABSTRACT

There is provided a photo-curable, electrically conductive composition which is capable of forming a lower layer (black layer) electrode circuit satisfying both the sufficient conductivity and blackness after calcination in the formation of an electrode on a front substrate of a plasma display panel (PDP). The composition comprises, in the first fundamental mode thereof, (A) electrically conductive black fine particles having a specific surface area of more than 20 $m^2/g$, (B) anorganic binder, (C) a photopolymerizable monomer, and (D) a photopolymerization initiator, and in the second mode further comprises (E) inorganic fine particles besides the above components. The lower layer (black layer) electrode circuit of bus electrodes (4a, 4b) of the PDP is formed by applying such a photo-curable, electrically conductive composition on transparent electrodes (3a, 3b) of a front glass substrate (1), exposing the applied layer to light according to a predetermined pattern, and subjecting the layer to development and calcination.

13 Claims, 2 Drawing Sheets

PHOTO-CURABLE ELECTRICALLY CONDUCTIVE COMPOSITION AND PLASMA DISPLAY PANEL HAVING ELECTRODES FORMED BY USE OF THE SAME

TECHNICAL FIELD

This invention relates to an electrically conductive composition of the alkali-developing type and photo-curable type useful for the formation of a fine electrode circuit on a front substrate of a plasma display panel (hereinafter abbreviated as a "PDP") and a PDP provided with a front substrate having electrodes, particularly under layers (black layers) of bus electrodes, formed by the use of the above composition.

BACKGROUND TECHNOLOGY

The PDP is a planar display for exhibiting pictures and pieces of information by utilizing the light emitted by plasma discharge. It is classified under the DC type and the AC type according to the structure of panel and the mode of driving. The principle of color display by the PDP consists in generating plasma discharge in cells (discharge spaces) between two opposed electrodes severally formed on a front glass substrate and a rear glass substrate separated by intervening ribs (barriers), and exciting the phosphor formed on the inner surface of the rear glass substrate with the ultraviolet light generated by the discharge of such a gas as He or Xe sealed in the cells thereby inducing generation of visible lights of three primary colors. The cells in the DC type PDP are divided by the component ribs of a lattice, whereas those in the AC type PDP are divided by the ribs which are arranged in parallel on the face of the substrate. In either case, the cells are divided by ribs. Now, a brief explanation is given below with reference to a drawing attached hereto.

FIG. 1 illustrates a typical construction of the planar discharge type PDP using a three-electrode structure for full color display. On the lower face of a front glass substrate 1, many pairs of display electrodes 2a, 2b each comprising a transparent electrode 3a or 3b intended for discharge and a bus electrode 4a or 4b intended for lowering the line resistance of the transparent electrode are formed with prescribed pitches. On the display electrodes 2a, 2b, a transparent dielectric layer 5 (low-melting glass) for accumulating electric charge is formed by printing and calcination. A protective layer (MgO) 6 is formed thereon by vacuum deposition. The protective layer 6 assumes the role of protecting the display electrodes and maintaining the state of discharge.

On a rear glass substrate 11, ribs (barriers) 12 shaped like stripes and adapted to partition discharge spaces and address electrodes (data electrodes) 13 severally disposed in the discharge spaces are formed with prescribed pitches. On the inner faces of discharge spaces, fluorescent films of the three colors, i.e. red (14a), blue (14b), and green (14c), are laid out regularly. In the full color display, the fluorescent films 14a, 14b, and 14c of the three primary colors of red, blue, and green mentioned above jointly form one picture element.

The PDP described above is called a "planar discharge system" because an AC pulse voltage is applied between the pair of display electrodes 2a, 2b to induce discharge between the electrodes on one and the same substrate. It has a construction such that the ultraviolet light generated by discharge excites the fluorescent films 14a, 14b, and 14c of the rear substrate 11 and the visible light consequently generated is seen through the transparent electrodes 3a, 3b of the front substrate 1 (reflection type).

The formation of the bus electrodes 4a, 4b mentioned above has been heretofore attained by a process which comprises forming three Cr/Cu/Cr layers by vacuum deposition or sputtering on the transparent electrode and then patterning the layers by the photolithographic technique. Since this process suffers copiousness of component steps and high cost of production, in recent years, a process which comprises screen printing a conductive paste such as of silver and then calcining the layer of the paste or, for the purpose of imparting to a pattern a line width of not more than 150 μm, a process which comprises applying a photo-sensitive conductive paste to the transparent electrode, exposing the layer of the paste to light through a pattern mask, developing the exposed layer, and subsequently calcining the developed layer has come to take the place of the former process.

In the front substrate of PDP on which the bus.electrodes 4a and 4b are formed in this way, in recent years, the formation of the electrode of the black-white two-layer structure is performed to increase the contrast of images by the method comprising the steps of printing an electrically conductive black paste having a relatively poor conductivity as a lower layer (layer in contact with the transparent electrodes 3a and 3b) on a display side and then printing a white layer of silver paste having good conductivity thereon. In this case, a resin composition containing a silver powder and a heat-resistant black pigment is used as the electrically conductive black paste. In such an electrically conductive black paste, accordingly, it is necessary to adjust the amounts of silver powder and black pigment incorporated into the composition while balancing the conductivity and blackness thereof. However, under the actual circumstances it is hardly possible to obtain the, electrodes which may satisfy both the conductivity and blackness. That is to say, if a large amount of silver powder is incorporated into the composition in order to secure conductivity, an electrically conductive film of clear black cannot be obtained due to a silver color tone. Conversely, if a large amount of black pigment is incorporated into the composition for the purpose of attaining a clear black color, it is hardly possible to obtain an electrically conductive film having a desired conductivity.

Accordingly, the present invention has been made to solve the problems involved in such conventional technology. The main object of the present invention is to provide a photo-curable, electrically conductive composition which is capable of forming a conductive film satisfying both the sufficient conductivity and blackness after calcination, without deteriorating the excellent adhesiveness to a substrate, resolution, and calcination properties of the electrically conductive composition in the component steps of process, i.e. drying, exposure to light, development, and calcination.

Another object of the present invention is to provide a PDP provided with the front substrate on which a highly fine electrode circuit formed of such a photo-curable, electrically conductive composition, particularly bus electrodes each consisting of two layers of black and white in which the lower layer (black layer) electrode circuit satisfies both the sufficient conductivity between layers (electrical conduction between a transparent electrode and a white layer of the bus electrode) and the blackness, is formed.

DISCLOSURE OF THE INVENTION

To accomplish the objects mentioned above, according to the present invention, there is provided a photo-curable, electrically conductive composition. The first fundamental mode of the present invention is characterized by comprising (A) electrically conductive black fine particles having a specific surface area of more than 20 m²/g, (B) an organic binder, (C) a photopolymerizable monomer, and (D) a photopolymerization initiator. The second mode is characterized by further comprising (E) inorganic fine particles besides the above-mentioned ingredients. As the electrically conductive black fine particles (A) mentioned above, at least one kind of, fine particles selected from the group consisting of ruthenium oxides, ruthenium compounds, copper-chromium-based black composite oxides, and copper-iron-based black composite oxides are advantageously used. Such a photo-curable, electrically conductive composition of the present invention may be in the form of paste or in the form of a dry film produced in advance from the composition in the form of film.

In accordance with the present invention, there is further provided a PDP provided with a front substrate having an electrode circuit formed from a calcined product of such a photo-curable, electrically conductive composition.

BEST MODE FOR CARRYING OUT THE INVENTION

Figure 1:
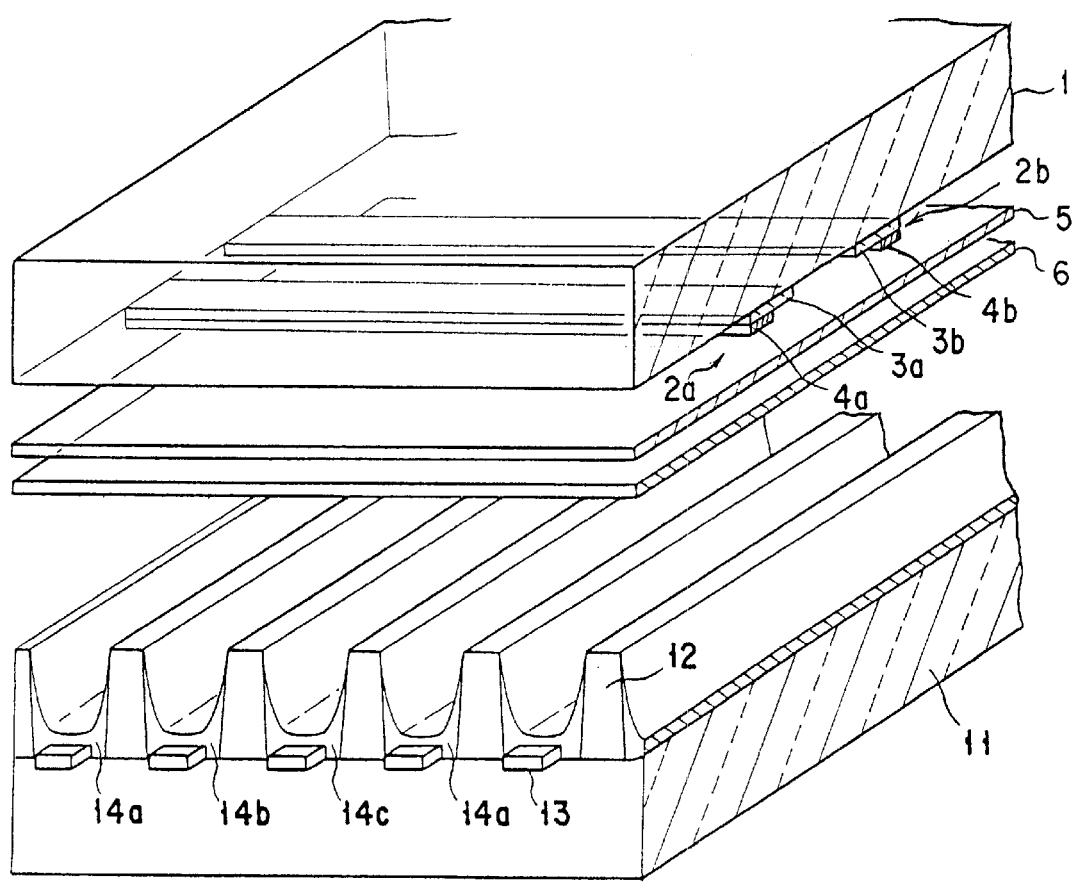
FIG. 1 is a fragmentary exploded perspective view of the AC type PDP of the conventional planar discharge system.

The present inventors have made a diligent study to accomplish the objects mentioned above. As a result, it has been found that when electrically conductive black fine particles having a specific surface area larger than 20 m²/g, particularly those containing at least one of ruthenium oxides, ruthenium compounds, and copper-chromium-based black composite oxides and/or copper-iron-based black composite oxides, are added as the electrically conductive fine particles (A) to a photo-curable, electrically conductive composition, the electrically conductive black film formed of the composition will become dense and can exhibit sufficient blackness even in the form of a thin film. Since the film is dense, it excels in conductivity even in the form of thin film and, consequently, satisfies both the sufficient conductivity between layers and sufficient blackness after calcination without deteriorating the excellent adhesiveness to a substrate, resolution, and calcination properties of the electrically conductive composition in the component steps of process, i.e. drying, exposure to light, development, and calcination. Therefore, if such a photo-curable, electrically conductive composition is used as a material of the black layer of the bus electrode consisting of two layers of black and white formed in the front substrate of PDP, the PDP can simultaneously satisfy both the electrical conduction between a transparent electrode and the white layer and the blackness when seeing from the screen side because the bus electrode has a sandwich structure such that the black layer is sandwiched in between the white layer and the transparent electrode such as ITO and NESA glass.

As mentioned above, the photo-curable, electrically conductive composition of the present invention uses fine particles having a specific surface area larger than 20 m²/g, preferably not more than 100 m²/g, as the electrically conductive fine particles. This is because, if the specific surface area thereof is larger than 20 m²/g it is possible to prepare a dense, calcined film without deteriorating the adhesiveness etc. even with the addition of a small amount thereof and to provide the conductive composition for lower layer (black layer) electrodes simultaneously satisfying the sufficient conductivity between layers and sufficient blackness.

On the other hand, the denseness of the calcined film decreases in proportion as the specific surface area of the electrically conductive black fine particles becomes smaller than 20 m²/g and, as being clear from the examples and the comparative examples mentioned hereinafter, the degree of blackness of the lower layer electrode film formed deteriorates and the resistivity thereof also tends, to become large. If the amount of the electrically conductive black fine particles incorporated into the composition is increased in order to heighten the degree of blackness, it will result in the problems that the permeation of light is prevented and the sufficient photo-curing properties are not acquired. Therefore, it is necessary to make the specific surface area of the electrically conductive black fine particles larger than 20 m²/g.

Since the process of preparing an electrode of PDP includes a high-temperature calcination at 500–600° C., the electrically conductive black fine particles should have the stability of color tone and conductivity at a higher temperature. For example, ruthenium oxides, ruthenium compounds, copper-chromium-based black composite oxides, copper-iron-based black composite oxides, etc. are advantageously used. Particularly, the best compounds are ruthenium oxides and ruthenium compounds because they are extremely excellent in color tone stability and conductivity stability at an increased temperature.

Since ruthenium oxides and ruthenium compounds contain ruthenium that is a rare metal, they are expensive. Accordingly, the use of these compounds in a large amount is not desirable because it boosts a cost. In this connection, when the electrically conductive fine particles having a specific surface area larger than 20 m²/g are used according to the present invention, it is possible to obtain the photo-curable, electrically conductive composition having a desired properties with the addition of a small amount of such particles. Specifically, the photo-curable, electrically conductive composition of the present invention has no problem in respect of cost and is advantageous also in the permeability to light because it contains a small amount of conductive particles that will prevent the permeation of light.

As the ruthenium oxides mentioned above, RuO$_2$ is desirable.

As the ruthenium compounds, ruthenium polyoxides represented by following general formula that is a kind of pyrochlore-type oxide, i.e. multi-component compound of Ru$^{4+}$, Ir$^{4+}$ or their mixture (M$^2$), may be cited.

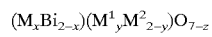

$(M_xBi_{2-x})(M^1{}_yM^2{}_{2-y})O_{7-z}$ wherein M represents at least one element selected from the group consisting of yttrium, thallium, indium, cadmium, lead, copper and rare earth metals; M$^1$ represents at least one element selected from the group consisting of platinum, titanium, chromium, rhodium and antimony; M$^2$ represents ruthenium, iridium or a mixture thereof; x is a number in the range of 0 to 2, with the proviso that x is ≦1 when M is univalent copper; y is a number in the range of 0 to 0.5, with the proviso that y is a number in the range of 0 to 1 when $M^1$ is rhodium or more than one of platinum, titanium, chromium, rhodium and antimony; and z is a number in the range of 0 to 1, being at least equal to about x/2 when M is divalent lead or cadmium. These ruthenium-based pyrbchlore-type oxides are described in detail in U.S. Pat. No. 3,583,931, the teachings of which are hereby incorporated by reference.

Preferred ruthenium-based pyrochlore-type oxides are bismuth ruthenate, $Bi_2Ru_2O_7$, and lead ruthenate, $Pb_2Ru_2O_6$. These oxides are relatively easy to prepare in pure form and they are not adversely affected with glass binders. Further, they have a relatively small TCR (temperature coefficient of resistivity) and are stable on heating in air up to about 1,000° C. They are also relatively stable in a reducing atmosphere. More preferred compound is lead ruthenate, $Pb_2Ru_2O_6$. Besides, $Pb_{1.5}Bi_{0.5}Ru_2O_{6.25}$, $CdBiRu_2O_{6.5}$, $NbBiRu_2O_7$, $BiInRu_2O_7$, $Bi_2IrRuO_7$, $GdBiRu_2O_7$, $BaRuO_3$, $Ba_2RuO_4$, $SrRuO_3$, $CaRuO_3$, $Co_2RuO_4$, $LaRuO_3$, $LiRuO_3$ and the like may be used.

The ruthenium oxides and ruthenium compounds as mentioned above may be used either singly or in the form of a combination of two or more members.

As the copper-chromium-based black composite oxides, $CuO—Cr_2O_3$ and $CuO—Cr_2O_3—Mn_2O_3$, for example, may be cited. As the copper-iron-based black composite oxides, $CuO—Fe_2O_3$, $CuO—Fe_2O_3—Mn_2O_3$, and $CuO—Fe_2O_3—Mn_2O_3—Al_2O_3$, for example, may be cited.

These electrically conductive black fine particles (A) may be used in various forms, such as spheres, flakes, and dendrites. In view of the photo-properties of the composition and the dispersibility in the composition, however, the globular particles are used preferably.

Properly, the amount of the electrically conductive black fine particles (A) to be incorporated in the composition is in the range of 0.1 to 100 parts by weight, preferably 5 to 50 parts by weight, based on 100 parts by weight of the organic binder (B). It is not preferable that the amount of the electrically conductive black fine particles to be incorporated be smaller than the lower limit of the range mentioned above, because the shortage will result in the film having insufficient conductivity and blackness after calcination. Conversely, it is also not preferable that the amount exceed the upper limit of the range mentioned above, because the excess will impair the permeability to light of the composition and boost a cost.

As the organic binder (B) mentioned above, any of carboxyl group-containing resins, specifically carboxyl group-containing photosensitive resins having an ethylenically unsaturated double bond in itself and carboxyl group-containing resins having no ethylenically unsaturated double bond may be used. As the resins which can be advantageously used herein.(either of oligomer and polymer may be adopted), the following resins may be cited:

(1) a carboxyl group-containing resin obtained by the copolymerization of (a) an unsaturated carboxylic acid with (b) a compound-having an unsaturated.double bond, (2) a carboxyl group-containing photosensitive resin obtained by adding an ethylenically unsaturated double bond as a pendant group to a copolymer of (a) an unsaturated carboxylic acid and (b) a compound having an unsaturated double bond, (3) a carboxyl group-containing photosensitive resin obtained by causing (a) an unsaturated carboxylic acid to react with a copolymer of (c) a compound having a glycidyl group and an unsaturated double bond and (b) a compound having an unsaturated double bond and then causing (d) a polybasic acid anhydride to react with the secondary hydroxyl group caused by the above reaction, (4) a carboxyl group-containing photosensitive resin obtained by causing (f) a compound having a hydroxyl group and an unsaturated double bond to react with a copolymer of (e) an acid anhydride having an unsaturated double bond and (b) a compound having an unsaturated double bond, (5) a carboxyl group-containing photosensitive resin obtained by causing (g) an epoxy compound to react with (h) an unsaturated monocarboxylic acid and then causing (d) a polybasic acid anhydride to react with the secondary hydroxyl group caused by the above reaction, (6) a carboxyl group-containing resin obtained by causing (i) an organic acid having one carboxylic group and no ethylenically unsaturated bond in its molecule to react with a glycidyl group of a copolymer of (b) a compound having an unsaturated double bond and glycidyl (meth)acrylate and then causing (d) a polybasic acid anhydride to react with the secondary hydroxyl group caused by the above reaction, (7) a carboxyl group-containing resin obtained by causing (d) a polybasic acid anhydride to react with (j) a hydroxyl group-containing polymer, and (8) a carboxyl group-containing photosensitive resin obtained by causing (d) a polybasic acid anhydride to react with (j) a hydroxyl group-containing polymer and then further causing (c) a compound having a glycidyl group and an unsaturated double bond to react with the resultant carboxyl group-containing resin.

Among other resins enumerated above, the carboxyl group-containing photosensitive resins (2)–(5) and (8) having an ethylenically unsaturated bond in itself are desirable.

The carboxyl group-containing resin (1) mentioned above is a copolymer of an unsaturated carboxylic acid (a) and a compound (b) having an unsaturated double bond. The carboxyl group-containing photosensitive polymer (2) mentioned above is a resin obtained by causing part of the carboxyl groups of the copolymer of the unsaturated carboxylic acid (a) and the unsaturated double bond-containing compound (b) to react with glycidyl (meth)acrylate, for example, at such a ratio as to improve the photo-curing properties until a sufficient photo-curing depth is obtained, thereby inducing introduction of the unsaturated double bond of this glycidyl (meth)acrylate into the side chain of the copolymer. Since the copolymer keeps part of the carboxyl groups contained in the unsaturated carboxylic acid (a) which is one of the monomer components of the aforementioned copolymer in the unreacted form, the carboxyl group-containing photosensitive polymer to be obtained continues to be soluble in an aqueous alkaline solution. The film which is formed of the electrically conductive composition containing such a resin, therefore, permits stable development with an aqueous alkaline solution after the selective exposure to light.

As concrete examples of the unsaturated carboxylic acid (a) mentioned above, acrylic acid, methacrylic acid, itaconic acid, crotonic acid, maleic acid, fumaric acid, vinylacetic acid, or anhydrides of these acids; and the reaction product of such an acid hydride as maleic anhydride, itaconic anhydride, or pyromellitic anhydride with such a hydroxyl group-containing unsaturated compound as 2-hydroxyethyl (meth)acrylate or 2-hydroxypropyl (meth)acrylate, and other similar hydroxyalkyl (meth)acrylates may be cited.

These unsaturated carboxylic acid may be used either singly or in the form of a combination of two or more members. Among other unsaturated carboxylic acids mentioned above, acrylic acid and/or methacrylic acid (when these acids are collectively referred, the term "(meth)acrylic acid" is used) are advantageously used. The term "(meth)acrylate" as used in the present specification refers collectively to acrylate and methacrylate.

As concrete examples of the aforementioned unsaturated double bond-containing compound (b), styrene, chlorostyrene, and α-methylstyrene; (meth)acrylates possessing methyl, ethyl, n-propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, butoxyethyl, 2-hydroxyethyl, 2-hydroxypropyl, and 3-chloro-2-hydroxypropyl as substituent(s); mono(meth)acrylates of polyethylene glycol and mono(meth)acrylates of polypropylene glycol; vinyl acetate, vinyl butyrate, and vinyl benzoate; and acrylamide, methacrylamide, N-hydroymethyl acrylamide, N-hydroxymethyl methacrylamide, N-methoxy ethyl acrylamide, N-ethoxymethyl acrylamide, N-butoxymethyl acrylamide, acrylonitrile, vinyl ethers, and isobutylene may be cited. These compounds may be used either singly or in the form of a mixture of two or more members. Among other compounds mentioned above, styrene, α-methylstyrene, lower alkyl (meth)acrylates, and isobutylene are advantageously used. In view of the thermal decomposition properties of the resin, methyl methacrylate is particularly desirable.

As the ethylenically unsaturated group-containing pendants, vinyl group, allyl group, acryloyl group, and methacryloyl group may be cited. As a method of adding such a pendant group to the copolymer mentioned above, the method of adding an ethylenically, unsaturated compound having a glycidyl group or (meth)acrylic chloride to the carboxylic group of the copolymer is generally adopted.

As the ethylenically unsaturated compound having glycidyl group or (meth)acrylic chloride used herein, glycidyl (meth)acrylate, allyl glycidyl ether, α-methylglycidyl (meth)acrylate, α-ethylglycidyl (meth)acrylate, chrotonyl glycidyl ether, chrotonic acid glycidyl ether, isochrotonic acid glycidyl ether, (meth)acrylic chloride, allyl chloride, methallyl chloride, and the compounds represented by the following formulas (1) to (4) may be cited. Among other compounds mentioned above, glycidyl (meth)acrylate is desirable.

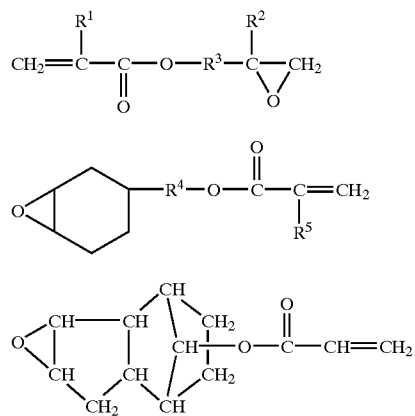

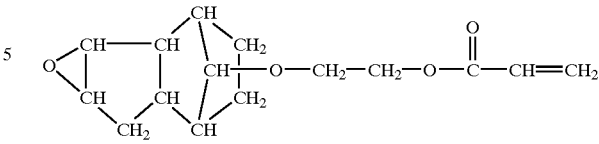

wherein, $R^1$, $R^2$, and $R^5$ independently represent a hydrogen atom or a methyl group, $R^3$ represents an aliphatic hydrocarbon of 1 to 12 carbon atoms, and $R^4$ represents

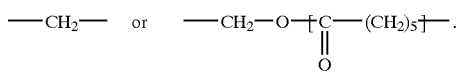

The carboxyl group-containing photosensitive resin (3) mentioned above is a resin obtained by causing the carboxyl group of (a) the unsaturated carboxylic acid mentioned above to react with the epoxy group of the copolymer of (c) the compound containing glycidyl group and an unsaturated double bond in its molecule and (b) the unsaturated double bond-containing compound mentioned above, at such a ratio as to improve the photo-curing properties until a sufficient photo-curing depth is obtained, thereby inducing introduction of the unsaturated double bond of the above unsaturated carboxylic acid into the side chain of the copolymer, and further causing the esterification reaction between the resultant secondary hydroxyl group caused by the above addition reaction and (d) the polybasic acid anhydride thereby inducing introduction of the carboxylic group into the side chain of the resin.

As concrete examples of the compound (c) containing a glycidyl group and an unsaturated double bond in its molecule mentioned above, glycidyl (meth)acrylate, α-methylglycidyl (meth)acrylate, and the compounds represented by the formulas (1) to (4) mentioned above may be cited. These compounds may be used either singly or in the form of a combination of two or more members.

On the other hand, as concrete examples of the polybasic acid anhydride (c), succinic anhydride, maleic anhydride, adipic anhydride, phthalic anhydride, tetrahydrophthalic anhydride, hexahydrophthalic anhydride, methylhexahydrophthalic anhydride, itaconic anhydride, methylendomethylenetetrahydrophthalic anhydride, trimellitic anhydride, and pyromellitic anhydride may be cited. These polybasic acid anhydrides may be used either singly or in the form of a combination of two or more members.

The carboxyl group-containing photosensitive resin (4) mentioned above is a resin obtained by causing part of the acid anhydride groups of the copolymer of the unsaturated double bond-containing acid anhydride (e) and the unsaturated double bond-containing compound (b) mentioned above to react with the hydroxyl group of the compound (f) having a hydroxyl group and an unsaturated double bond to produce a half ester, at such a ratio as to improve the photo-curing properties until a sufficient photo-curing depth is obtained, thereby inducing introduction of the unsaturated double bond of the compound (f) mentioned above into the side chain of the copolymer.

As concrete examples of the unsaturated double bond-containing acid anhydride (e) mentioned above, maleic anhydride, itaconic anhydride, andpartial reaction product of pyromellitic anhydride with a hydroxyl group-containing unsaturated compound such as hydroxyalkyl (meth)acrylate like 2-hydroxyethyl (meth)acrylate and 2-hydrokypropyl (meth)acrylate may be cited. These acid anhydrides may be used either singly or in the form of a combination of two or more members. Among other acid anhydrides cited above, maleic anhydride is particularly desirable from the viewpoint of stable synthesis of the polymer.

As concrete examples of the compound (f) having a hydroxyl group and an unsaturated double bond, hydroxyalkyl (meth)acrylates such as 2-hydroxyethyl (meth)acrylate and 2-hydroxypropyl (meth)acrylate; a monomer obtained by the reaction of (meth)acrylate with polycaprolactone, a macromonomer obtained by the reaction of (meth)acrylate with polycaprolactone oligomer may be cited. These compounds may be used either singly or in the form of a combination of two or more members.

The carboxyl group-containing photosensitive resins (2)–(4) mentioned above excel in photo-curing properties and calcining properties, do not impair the effects of a stabilizer described hereinafter, and contribute to the storage stability of the composition.

The carboxyl group-containing photosensitive resin (5) mentioned above is a resin obtained by causing the carboxyl group of (h) the unsaturated monocarboxylic acid to react with the epoxy group of (g) the epoxy compound to produce an epoxy acrylate, for example, at such a ratio as to improve the photo-curing properties until a sufficient photo-curing depth is obtained, and further causing the esterification reaction between the resultant secondary hydroxyl group caused by the above addition reaction and (d) the polybasic acid anhydride thereby inducing introduction of the carboxylic group into the side chain of the resin. This carboxyl group-containing photosensitive resin excels in photo-curing properties and the epoxy acrylate of its backbone polymer exhibits hydrophobic nature. Accordingly, when the photo-curable, electrically conductive composition containing this resin is used, the hydrophobic nature of the epoxy acrylate is advantageously utilized and thus the resistance thereof to development in the bottom part of the pattern difficult to photocure is improved. As a result, the allowance of setting the conditions for the processes of developing and exposure to light is widened, the yield in the mass-production is heightened, the occurrence of curl in the pattern edge after calcination is remarkedly decreased, and the fine electrode circuit with a high aspect ratio can be formed.

Incidentally, an acrylic copolymer resin which is susceptible to depolymerization by the heat of calcination may be mixed with the aforementioned carboxyl group-containing photosensitive resin thereby lowering a calcination temperature of the electrically conductive composition and adjusting the concentration of double bonds contained in the whole resins to be used.

As concrete examples of the epoxy compound (g) mentioned above, any epoxy resin may be used. Typical examples thereof include bisphenol A type, hydrogenated bisphenol A type, bisphenol F type, bisphenol S type, phenol novolak type, cresol novolak type, bisphenol A novolak type, biphenol type, bixylenol type, N-glycidyl type, and other well known and widely used epoxy compounds. As commercially available, preferred substances, EHP-3150 produced by Daicel Chemical Industries, Ltd. etc. may be cited. These epoxy compounds may be used either singly or in the form of a combination of two or more members.

As concrete examples of the unsaturated monocarboxylic acid (h), acrylic acid, methacrylic acid, crotonic acid, maleic acid, fumaric acid, itaconic acid, cinnamic acid, α-cyanocinnamic acid, β-styryl acrylic acid, β-furfuryl acrylic acid, etc. may be cited. These unsaturated monocarboxylic acids may be used either singly or in the form of a combination of two or more members.

The reaction of the epoxy compound (g) and the unsaturated monocarboxylic acid (h) mentioned above is preferred to be effected in such a proportion that the ratio of equivalent weight of the epoxy group/equivalent weight of the carboxyl group falls in the range of 0.8 to 1.2, preferably 0.9 to 1.05. If the ratio of equivalent weight of the epoxy group/equivalent weight of the carboxyl group is less than 0.8, the problem of smell will arise due to the remaining unsaturated monocarboxylic acid. Conversely, if the equivalent ratio mentioned above exceeds 1.2, a large amount of epoxy group will remain, which will cause the undesired gelation during the subsequent reaction with the polybasic acid anhydride. The reaction ratio of the polybasic acid anhydride to the resultant secondary ,hydroxyl group is adjusted such that the acid value of the resin obtained in the final stage falls in the preferred range of 30 to 160 mg KOH/g. In general, the equivalent weight of the acid anhydride per one equivalent weight of the hydroxyl group caused by the reaction of the epoxy compound and the unsaturated monocarboxylic acid is not less than 0.3, preferably not less than 0.5.

The carboxyl group-containing resin (6) mentioned above is a resin obtained by causing (i) the organic acid having one carboxylic group and no ethylenically unsaturated bond in its molecule to react with the glycidyl group of the copolymer having a main chain comprising glycidyl (meth)acrylate and a compound having an unsaturated double bond, but no hydroxyl group or acid group, such as alkyl (meth)acrylate and substituted or unsubstituted styrene, and then causing (d) the polybasic acid anhydride mentioned above to react with the resultant secondary hydroxyl group. In this resin, the introduction of the carboxylic group is effected by causing the polybasic acid anhydride to react with the secondary hydroxyl group which is caused by the reaction of the organic acid and the pendant glycidyl group of the copolymer mentioned above and has a site near the main chain. Accordingly, the carboxylic group is bonded to the side chain at the site in the neighborhood of the main chain and, thus, is prevented from the contact with the basic conductive particles owing to the steric hindrance of the main chain and the side chain. As a result, the composition containing this alkali-soluble carboxyl group-containing resin together with conductive particles exhibits the excellent storage stability and sparingly cause the change in viscosity and gelation during storage.

As the organic acid (i) having one carboxylic group and no ethylenically unsaturated bond in its molecule, alkylcarboxylic acids having 2 to 17 carbon atoms such as acetic acid, propionic acid, n-butyric acid, isobutyric acid, n-dimethylbutyric acid, ethylbutyric acid, hexanoic acid, 2-methylpentanoic acid, 2-ethylpentanoic acid, heptanoic acid, 2-methylheptanoic acid, lauric acid stearic acid, and n-heptadecanoic acid; and aromatic group-containing alkylcarboxylic acids such as substituted or unsubstituted benzoic acid, (R), (S)-2-phenylpropionic acid, (R)-phenylisopropionic acid 2-phenylbutyric acid, and 4-phenylbutyric acid may be cited. These organic acids may be used either singly or in the form of a combination of two or more members.

The carboxyl group-containing resin (7) mentioned above is a resin obtained by causing (d) the aforementioned polybasic acid anhydride having a relatively weak acidity to react with (j) a hydroxyl group-containing polymer thereby inducing introduction of the carbbxylic acid into the resin. Since this carboxyl group-containing resin has hydrophilic groups (carboxyl group and hydroxyl group), it exhibits a good wettability to a substrate and easily pyrolytically decomposes at a high temperature. The electrically conductive composition containing this resin exhibits a stable adhesiveness to a substrate during component steps of process, i.e. drying, exposure to light, development, and calcination and good storage stability and excels in calcination properties.

The carboxyl group-containing photosensitive resin (8) mentioned above is a resin obtained by causing the epoxy group of (c) the aforementioned compound having a glycidyl group and an unsaturated double bond to react with the carboxyl group of the carboxyl group-containing resin (7) mentioned above at such a ratio as to improve the photo-curing properties until a sufficient photo-curing depth is obtained, thereby inducing introduction of the unsaturated double bond of the compound (c) mentioned above into the side chain of the resin. This carboxyl group-containing photosensitive resin excels in photo-curing properties and exhibits sufficient photo-curing depth even if the electrically conductive composition is formulated by blending this resin with a large amount of a conductive powder. Further, it excels in calcining properties, does not impair the effects of a stabilizer described hereinafter, and contributes to the storage stability of the composition.

As the hydroxyl group-containing polymer (j) mentioned above, olefinic hydroxyl group-containing polymers, acrylic polyols, rubber-based polyols, polyvinyl acetals, styrene-allyl alcohol-based resins, cellulose and its derivatives may be used.

As the olefinic hydroxyl group-containing polymer, such resins as have polyethylene, polypropylene, polybutadiene, etc. as a main chain and have hydroxyl groups bonded to either a main chain or a side chain thereof may be used. The copolymers of allyl alcohol with ethylene or butadiene may also be used.

As concrete examples of the acrylic polyocls, the products of Mitsubishi Rayon Company Limited; LR2507, LR2516, LR257, LR989, LR2536, LR532, LR598, LR566, LR286, LR511, and LR2528 and the like may be cited. As concrete examples of the rubber-based polyols, the product of Mitsui Petrochemical Industries, Ltd.; Unistol P901, the products of Kuraray Co., Ltd.; Kuraprene LIR-506, TL-20, TH-1, TH-21, and TH-31, Kurapol P-510, Kurapol P-15610, and Kurapol P-5010 and the like may be cited. And, as concrete examples of the styrene-allyl alcohol resins, the products of Monsanto K.K.; RJ100 and RJ101, the products of Arco Chemical K.K.; SAA100 and SAA101, and the like may be cited.

As the polyvinyl acetal, polyvinyl butyral, polyvinyl acetal, polyvinyl formal, and the like may be used. As concrete examples thereof, the products of Sekisui Chemical Co., Ltd.; Eslex BMS, Eslex BLS, Eslex BHS, Eslex BLSH, and Eslex BMSH and the like may be cited.

As cellulose and its derivatives, cellulose, acetyl cellulose and nitrocellulose resulting from the esterification of part of the hydroxyl groups of cellulose, and cellulose esters of such acids as propionic acid, butyric acid, phosphoric acid, sulfuric acid, phthalic acid, etc. may be cited. Mixed esters which incorporate acids therein are also usable. Further, cellulose ethers such as methyl cellulose, ethyl cellulose, benzyl cellulose carboxymethyl cellulose, etc. which result from the etherification of part of the hydroxyl groups of cellulose may be used.

Though any polymer other than those cited above is usable as the hydroxyl group-containing polymer (j), it is preferred to have a hydroxyl value in the range of 50 to 250 (KOH)mg/g.

Incidentally, hydroxypropylmethyl cellulose phthalate, hydroxypropylmethyl cellulose acetate succinate, cellulose acetate hexahydrophthalate, hydroxypropylmethyl cellulose acetate phthalate, hydroxypropylmethyl cellulose hexahydrophthalate, etc which are produced by Shin-Etsu Chemical Industry Co., Ltd. can be used in their unmodified form as the carboxyl group-containing resin (7).

The carboxyl group-containing photosensitive resins and the carboxyl group-containing resins mentioned above may be used either singly or as a mixture. In either case, the total amount of the resin or resins to be incorporated in the composition is preferred to account for a proportion in the range of 10 to 80% by weight based on the total amount of the composition. If the amount of these resins to be incorporated is unduly smaller than the lower limit of the range mentioned above, the uniformity of the distribution of the above resin in the film to be formed will be easily impaired, no sufficient photo-curing properties or photo-curing depth will be easily obtained, and the patterning by selective exposure to light and development will be attained only with difficulty. Conversely, if the amount is unduly larger than the upper limit of the range mentioned above, such defects as distortion of pattern and contraction of line width will arise during the course of calcination.

The carboxyl group-containing photosensitive resins and the carboxyl group-containing resins mentioned above can be used advantageously when their weight-average molecular weights each fall in the range of 1,000 to 100,000, preferably 5,000 to 50,000, the, acid values each fall in the range of 20 to 150 mg KOH/g, preferably 40 to 120 mg KOH/g, and in the case of the carboxyl group-containing photosensitive resins, their double bond equivalent weights fall in the range of 350 to 2,000, preferably 400 to 1,500.

If the molecular weight of the resin mentioned above is less than 1,000, the resin will bring an adverse effect on the fastness of adhesion of the electrically conductive film during the course of development. Conversely, if the molecular weight exceeds 100,000, the resin will tend to impair the operation of development. If the acid value is smaller than 20 mg KOH/g, the solubility of the resin in an aqueous alkaline solution will be insufficient and the development will tend to prove defective. Conversely, if the acid value is larger than 150 mg KOH/g, the fastness of adhesion of the electrically conductive film will be degraded and the photo-cured part (exposed part) will tend to produce dissolution during the course of development.

Further in the case of the carboxyl group-containing photosensitive resin, if the double bond equivalent weight of the photosensitive resin is less than 350, the shortage will encourage the occurrence of calcining residue. If it is larger than 2,000, the excess will bring a narrower allowance in the operation of development and an undue addition to the exposure dose required for the photo-curing.

The photopolymerizable monomer (C) is used in the present invention to promote the photo-curing of the composition and to improve the developing properties. As examples of the photopolymerizable monomer, 2-hydroxyethyl acrylate, 2-hydroxypropyl acrylate, diethylene glycol diacrylate, triethylene glycol diacrylate, polyethylene glycol diacrylate, polyurethane diacrylate, trimethylol propane triacrylate, pentaerythritol triacrylate, pentaerythritol tetraacrylate, ethylene oxide-modified trimethylol propane triacrylate, propylene oxide-modified trimethylol propane triacrylate, dipentaerythritol pentaacrylate, dipentaerythritol hexaacrylate, and methacrylates corresponding to the acrylates enumerated above; and mono-, di-, tri-, and higher polyesters of hydroxyalkyl (meth)acrylates with polybasic acids such as phthalic acid, adipic acid, maleic acid, itaconic acid, succinic acid, trimellitic acid, and terephthalic acid may be cited. It should be noted, however, that these are not exclusive examples. These photopolymerizable monomers may be used either singly or in the form of a combination of two or more members. Among other photopolymerizable monomers, polyfunctional monomers having tow or more acryloyl groups or methacryloyl groups prove to be preferable.

The appropriate amount of these photopolymerizable monomers (C) to be incorporated into the composition is in the range of 20 to 100 parts by weight, based on 100 parts by weight of the organic binder (B) mentioned above (carboxyl group-containing photosensitive resin and/or carboxyl group-containing resin). If the amount of the photopolymerizable monomers (C) to be incorporated is less than the lower limit of the above range, the shortage will tend to render the impartation of sufficient photo-curing properties to the composition difficult. Conversely, if the amount is unduly large so as to exceed the above range, the excess will cause uneven hardening of the composition because the photo-curing speed in the surface part is faster than that in the bottom part of the film.

As concrete examples of the photopolymerization initiators (D) mentioned above, benzoin and alkyl ethers thereof such as benzoin, benzoin methyl ether, benzoin ethylether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropan-1-one and 2-benzyl-2-dimethylamino-1-(4-mbrpholinophenyl)-butanone-1; anthraquinones such as 2-methylanthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone; or xanthones; phosphineoxides such as (2,6-dimethoxybenzoyl)-2,4,4-pentyl phosphine oxide, bis(2,4,6-trimethylbenzoyl)-phenyl phosphine oxide, 2,4,6-trimethylbenzoyl-diphenyl phosphine oxide, and ethyl-2,4,6-trimethylbenzoyl-phenyl phosphinate; and various peroxides may be cited. These well known and widely used photopolymerization initiators may be used either singly or, in the form of a combination of two or more members. The amount of the photopolymerization initiator (D) to be incorporated into the composition is preferred to be in the range of 1 to 30 parts by weight, preferably 5 to 20 parts by weight, based on 100 parts by weight of the organic binder (B) mentioned above (carboxyl group-containing photosensitive resin and/or the carboxyl group-containing resin).

Optionally, such a photopolymerization initiator (D) may be used in combination with one or more photosensitizers such as tertiary amines like N,N-(dimethylamino)ethyl benzoate, N,N-(dimethylamino)isoamyl benzoate, pentyl-4-dimethylamino benzoate, triethylamine, and triethanolamine.

Where the photo-curing depth is required to be greater, such a titanothene type photopolymerization initiator as the product of Ciba Specialty Chemicals K.K., Irgacure 784, which initiates radical polymerization in a visible region and a leuco-dye may be optionally used as a curing aid in combination with the above photopolymerization initiator.

The composition of the present invention may optionally incorporate therein inorganic fine particles (E) such as a glass powder having a softening point of 400 to 600° C., a conductive powder, a heat-resistant black pigment, and a silica powder.

For the purpose of enabling the electrically conductive circuit formed after calcination to exhibit improved fastness of adhesion to a substrate, a glass powder may be additionally incorporated in a proportion of not more than 200 parts by weight, preferably not more than 150 parts by weight, based on 100 parts by weight of the conductive fine particles (A). The glass powder is preferred to have a glass transition point (Tg) in the range of 300–500° C. and a softening point (Ts) in the range of 400–600° C. The glass powder is preferred to possess an average particle diameter of not more than 20 $\mu$m, preferably not more than 5 $\mu$m, from the viewpoint of resolution.

The incorporation of the low-melting glass powder mentioned above into the photo-curable, electrically conductive composition enables the film obtained after exposure to light and development to be easily calcined at a temperature of not more than 600° C. and is particularly advantageous in the formation of electrodes of the PDP. The composition of the present invention uses the organic binder which has good burning characteristics and is formulated so that the removal of binder is completed before the glass powder begins to melt. If the softening point of the glass powder is less than 400° C., however, it begins to melt at a temperature lower than the above temperature and tends to envelop the organic binder. This will result in such problems as tending to cause blister in the composition due to the decomposition of the remaining organic binder in the composition.

As the low-melting glass powder, the glass powder which use lead oxide, bismuth oxide, zinc oxide, or lithium oxide as a main component can be advantageously used.

One preferable example of the glass powder containing lead oxideas the main component thereof is an amorphous frit which is composed of, in percent by weight of oxide basis, 48–82% of PbO, 0.5–22% of $B_2O_3$, 3–32% of $SiO_2$, 0–12% of $Al_2O_3$, 0–10% of BaO, 0–15% of ZnO, 0–2.5% of $TiO_2$, and 0–25% of $Bi_2O_3$ and has a softening point in the range of 420–590° C.

One preferable example of the glass powder containing bismuth oxide as the main component thereof is an amorphous frit which is composed of, in percent by weight of oxide basis, 35–88% of $Bi_2O_3$, 5–30% of $B_2O_3$, 0–20% of $SiO_2$, 0–5% of $Al_2O_3$, 1–25% of BaO, and 1–20% of ZnO and has a softening point in the range of 420–590° C.

One preferable example of the glass powder containing zinc oxideis an amorphous frit which is composed of, in percent by weight of oxide basis, 25–60% of ZnO, 2–15% of $K_2O$, 25–45% of $B_2O_3$, 1–7% of $SiO_2$, 0–10% of $Al_2O_3$, 0–20% of BaO, and 0–10% of MgO and has a softening point in the range of 420–590° C.

One preferable example of the glass powder containing lithium oxide: as the main component thereof is an amorphous frit which is composed of, in percent by weight of oxide basis, 1–13% of $Li_2O$, 0–30% of $Bi_2O_3$, 1–50% of $B_2O_3$, 1–50% of $SiO_2$, 1–40% of $Al_2O_3$, 1–20% of BaO, and 1–25% of ZnO and has a softening point in the range of 420–590° C.

As the conductive powder, any conductive powder having a specific resistance of not more than $1\times10^3$ $\Omega\cdot$cm can be widely used. For example, simple substance such as silver (Ag), gold (Au), nickel (Ni) copper (Cu), aluminum (Al), tin (Sn), lead (Pb), zinc (Zn), iron (Fe), platinum (Pt), iridium (Ir), osmium (Os), palladium (Pd), rhodium (Rh), ruthenium (Ru), tungsten (W), and molybdenum (Mo) and alloys thereof, tin oxide (SnO2), indium oxide (In2O3), and ITO (indium tin oxide) may be used. The conductive powders mentioned above may be used either singly or in the form of a mixed powder of two or more members in combination with the conductive fine particles (A).

Although the conductive powders mentioned above may be used in any form of spheres, flakes, and dendrites, it is preferable to use the powder in the form of sphere from the viewpoint of the photo-curing properties of the composition and the dispersibility thereof in the composition. From the viewpoint of resolution, the powder is preferred to have an average particle diameter of not more, than 20 μm, preferably not more than 5 μm. Further, in order for the conductive metal powder to be prevented from oxidation, improved in dispersibility in the composition, and allowed to acquire a stabilized developing property, particularly Ag, Ni, or Al powder is preferred to be treated with a fatty acid. As the fatty acids oleic acid, linolic acid, linolenic acid, and stearic acid may be cited.

The appropriate amount of the conductive powder to be incorporated in the composition is up to 100 parts by weight, based on 100 parts by weight of the aforementioned organic binder (B). If the amount of the conductive powder to be incorporated is large so as to exceed 100 parts by weight, the excess will impair the permeation of light and render the impartation of sufficient photo-curing properties to the composition difficult. Further, when the conductive powder which does not exhibit a black color is added to the composition, it will be difficult to obtain the electrically conductive composition for the black layer electrode capable of satisfying the sufficient blackness.

When a large amount of the conductive powder or the low-melting glass powder is incorporated into the composition, in general the composition entails such problems as tending to suffer degradation of stability of storage and impairment of the operational efficiency of coating work owing to the gelation or the decline of flow ability of the composition.

Accordingly, for the purpose of improving the storage stability of the composition, it is preferable to incorporate into the composition of the present invention a compound which is capable of forming a complex or a salt in conjunction with a metal that is a constitutional element of the conductive powder and glass or with the oxide powder, as a stabilizer. As the examples of the stabilizer, such acids as inorganic acids, organic acids, and phosphoric acid compounds (inorganic phosphoric acid and organic phosphoric acid) may be cited. Such a stabilizer is preferred to be incorporated in an amount in the range of 0.1 to 10 parts by weight, based on 100 parts by weight of the glass powder or the conductive powder mentioned above.

As the examples of the inorganic acid, nitric acid, sulfuric acid, hydrochloric acid, and boric acid may be cited.

As the examples of the organic acid, formic acid, acetic acid, acetoacetic acid, citric acid, isocitric acid, anisic acid, propionic acid, butyric acid, isobutyric acid, valeric acid, isovaleric acid, azelaic acid, caproic acid, isodaproic acid, enanthic acid, caprylic acid, pelargonic acid, undecanoic acid, laurylic acid, tridecanoic acid, myristic acid, palmitic acid, stearic acid, arachic acid, behenic acid, oxalic acid, malonic acid, ethylmalonic acid, succinic acid, glutarlc acid, adipic acid, pimelic acid, pyruvic acid, piperonic acid, pyromellitic acid, suberic acid, azelaic acid, sebacic acid, maleic acid, fumaric acid, phthalic acid, isophthalic acid, terephthalic acid, tartaric acid, levulinic acid, lactic acid, benzoic acid, isopropylbenzoic acid, salicylic acid, isocaproic acid, crotonic acid, isocrotonic acid, acrylic acid, methacrylic acid, tiglic acid, ethylacrylic acid, ethylidene propionic acid, dimethylacrylic acid, citronellic acid, undeceneic acid, undecanoic acid, oleic acid elaidic acid, erucic acid, brassidic acid, phenylacetic acid, cinnamic acid, methylcinnamic acid, naphthoeic acid, abietic acid, acetylene dicarboxylic acid, atrolactinic acid, itaconic acid, crotonic acid, sorbic acid, vanillic acid, palmitic acid, hydroxycinnamic acid, hydroxynaphtheic acid, hydroxybutyric acid, biphenyl dicarboxylic acid, phenylcinnamic acid, phenylacetic acid, phenylpropionic acid, phenoxyacetic acid, propionic acid, hexanic acid, heptanoic acid, veratric acid, benzilic acid, oxalosuccinic acid, oxaloacetic acid, octanoic acid, gallic acid, mandellic acid, messaconic acid, methylmaroic acid, mellitic acid, lauric acid, ricinoleic acid, linoleic acid, and malic acid may be cited.

As the examples of the inorganic phosphoric acid, phosphoric acid, phosphorous acid, hypophosphorous acid, orthophosphoric acid, diphosihoric acid, tripolyphospshoric acid, and phosphonic acid may be cited.

As the, examples of the organic phosphoric acid, methyl phosphate, ethyl phosphate, propyl phosphate, butyl phosphate, phenyl phosphate, dimethyl phosphate, diethyl phosphate, dibutyl phosphate, dipropyl phosphate, diphenyl phosphate, isopropyl phosphate, diisopropyl phosphate, n-butyl phosphate, methyl phosphite, ethyl, phosphite, propyl phosphite, butyl phosphite, phenyl phosphite, dimethyl.phosphite, diethyl phosphite, dibutyl phosphite, dipropyl phosphite, diphenyl phosphite, isopropyl phosphite, diisopropyl phosphite, n-butyl-2-ethylhexyl phosphite, hydroxyethylene diphosphonric acid, adenosine triphosphoric acid, adenosin, phosphoric acid, mono(2-methacryloyloxyethyl)acid phosphate, mono(2-acryloyloxyethyl)acid phosphate, di(2-methacryloyloxyethyl)acid phosphate, di(2-acryloyloxyethyl)acid phosphate, ethyldiethylphosphonoacetate, ethyl acid phosphate, butyl acid phosphate, butylpyrophosphate, butoxyethyl acid phosphate, 2-ethylhexyl acid phosphate, oleyl acid phosphate, tetracosyl acid phosphate, diethylene glycol acid phosphate, and (2-hydroxyethyl)methacrylate acid phosphate may be cited.

As other acids, such sulfonic acids as benzenesulfonic acid, toluenesulfonic acid, naphthalenesulfonic acid, ethane sulfonic acid, naphtholsulfonic acid, taurine, methanillic acid, sulfanilic acid, naphthylaminesulfonic acid, sulfobenzoic acid, and sulfamic acid are also usable.

The stabilizers enumerated above may be used either singly or in the form of a combination of two or more members.

As the heat-resistant black pigment, inorganic pigments which excels in heat resistance may be widely used. In general, such pigments are oxides or composite oxides of Cr, Co, Ni, Fe, or Mn and may be used either singly or in the form of a combination of two or more members.

As a silica powder, a synthetic amorphous silica fine powder is particularly desirable. As concrete examples thereof, the products of Nippon Aerosil K.K.; AEROSIL (registered trademark) 50, 130, 200, 200V, 200CF, 200FAD, 300, 300CF, 380, OX50, TT600, MOX80, MOX170, and COK84; and the products of Nippon Silica Industries K.K.; Nipsil (registered trademark) AQ, AQ-S, VN3, LP, L300, N-300A, ER-R, ER, RS-150, ES, NS, NS-T, NS-P, NS-KR, NS-K, NA, KQ, KM, and DS and the like may be cited. These silica powders may be used either singly or in the form of a combination of two or more members. Among other silica powders, the powder having a primary particle diameter of 5–50 nm and a specific surface area of 50–500 $m^2/g$ is desirable.

When the aforementioned synthetic amorphous silica powder having a silanol group is added to the photo-curable, electrically conductive composition containing the aforementioned carboxyl group-containing resin and the electrically conductive black powder in combination, the composition exhibits excellent adhesiveness to a substrate in the component steps of process, i.e. drying, exposure to light, development, and calcination. Further, the occurrence of separation between the substrate and the black layer or between the black layer and the white layer or the curls thereof during the step of calcination in the preparation of the bus electrodes can be effectively prevented. Although no fully convincing reason has been assigned for this improvement yet, the improvement may be logically explained as follows. Before the calcination, a dense coating film formed on the substrate exhibits excellent adhesiveness to the substrate owing to the hydrogen bond between the hydrogen atom of the silanol group in the surface of the synthetic amorphous silica and the oxygen atom of the carboxyl group contained in the glass substrate used as a substrate or in the resin or further to the Coulomb's force between the electrically negative oxygen atom of the silanol group and the electrically positive metal of the electrically conductive powder. After the calcination, the synthetic amorphous silica fine particles penetrate into the gaps between the glass substrate and the electrically conductive particles and between the electrically, conductive particles as well thereby enhancing the adhesive strength therebetween.

In accordance with the present invention, the composition is transformed by dilution into a pasty constitution capable of easy application to a substrate and the applied layer of the paste is dried to form a film capable of contact exposure. The composition, therefore, can incorporate therein a suitable amount of an organic solvent. As concrete examples of the organic solvents, ketones such as methyl ethyl ketone and cyclohexanone; aromatic hydrocarbons such as toluene, xylene, and tetramiethyl benzene; glycol ethers such as cellosolve, methyl cellosolve, carbitol, methyl carbitol, butyl carbitol, propylene glycol monomethyl ether, dipropylene glycol monomethyl ether, dipropylene glycol monoethyl ether, and triethylene glycol monoethyl ether; acetates such as ethyl.acetate, butyl acetate, cellosolve acetate, butyl cellosolve acetate, carbitol acetate, butyl carbitol acetate, and propylene glycol monomethylether acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha may be cited. These organic solvents may be used either singly or in the form of a combination of two or more members.

The photo-curable, electrically conductive composition of the present invention may further incorporate therein, as occasion demands, such other additives as a silicone-based or acrylic anti-foaming and leveling agent and a silane coupling agent for improving the adhesiveness of the film. It may also incorporate therein, as occasion demands, a known and popularly used antioxkidant for preventing the conductive metal powder from oxidation, a thermal polymerization inhibitor for improving the thermal stability during storage, and fine particles of metallic oxide, silicon oxide, or boric oxide as a binding component with the substrate during the calcining work.

When the photo-curable, electrically conductive composition of the present invention is prepared in the form of film in advance, it may be laminated onto a substrate. When the composition is in the form of paste, it is applied to a substrate, for example, a glass substrate as a front substrate of the PDP by a suitable method such as screen printing method, bar coater, or blade coater. The applied layer of the paste is then dried with a hot air circulation type drying oven or a far infrared drying oven at a temperature in the approximate range of 60–120° C. for a period in the approximate range of 5 to 40 minutes, for example, to expel an organic acid and produce a tack-free coating film. Then, this film is subjected to selective exposure to light, development, and calcination to give rise to an electrode circuit of a predetermined pattern.

The step of exposure to light can be accomplished by the contact exposure using a negative mask containing a prescribed exposure pattern or noncontact exposure. In terms of resolution, the contact exposure is preferred to the noncontact exposure. The light sources which are usable for the exposure include a halogen lamp, a high-pressure mercury-vapor lamp, a laser beam, a metal halide lamp, a black lamp, and an electrode less discharge lamp, for example. A preferred irradiation rage of 50 to 1,000 mJ/cm$^2$.

For the step of development, the spray method, the immersion method, etc. may be used. As a developing solution, the aqueous solutions of such alkali metals as sodium hydroxide, potassium hydroxide, sodium carbonate, potassium carbonate, and sodium silicate and the aqueous solutions of amines such as monoethanolamine, diethanolamine, and triethanolamine can be used advantageously. A particularly advantageous developing solution is a dilute alkaline aqueous solution having a concentration not more than about 1.5% by weight. The developing solution is only required to saponify the carboxyl groups of the carboxyl group-containing resin in the composition and permit removal of the uncured areas (unexposed areas) and, therefore, is not required to be limited to the developing solution cited above. After the step of development, the developed layer is preferred to be washed with water or neutralized with an acid for the removal of the unwanted residual developing solution.

At the calcining step, the substrate which has undergone the development is heat-treated in the air or an atmosphere of nitrogen at a temperature in the approximate range of 400–600° C. to give a required conductor pattern. At this time, the speed of temperature increase is preferred to be not more than 15° C./minute.

Figure 2A:
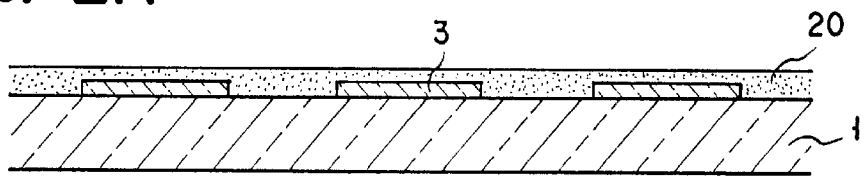
FIGS. 2A through 2E are fragmentary sectional views for an explanation of the process of one embodiment of the method for the manufacture of bus electrodes of PDP by using the photo-curable, electrically conductive composition of the present invention.
Figure 2B:
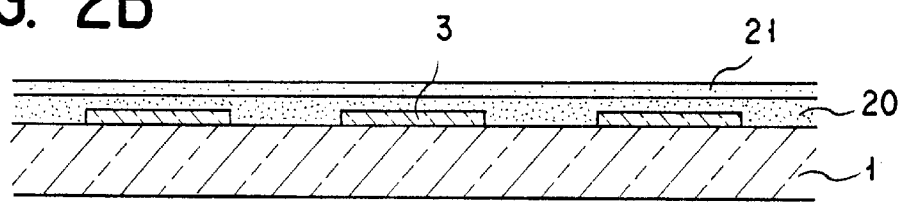
Figure 2C:
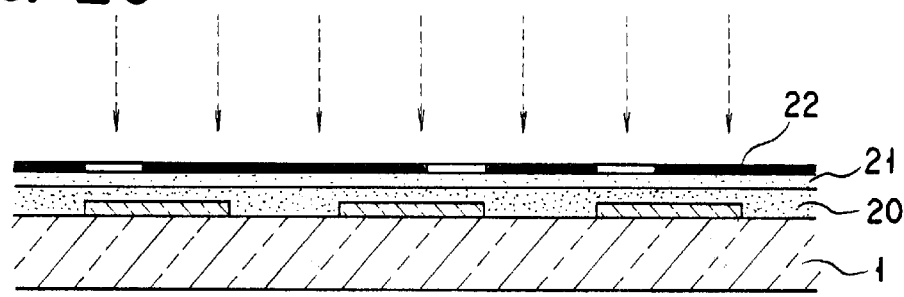
Figure 2D:
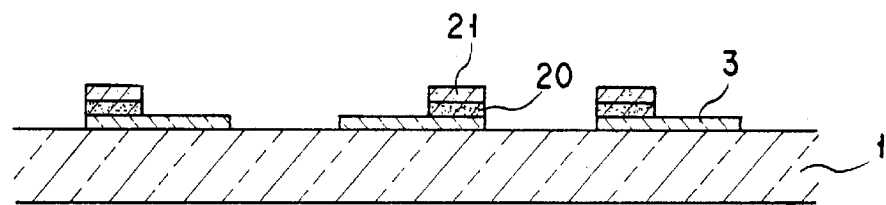
Figure 2E:
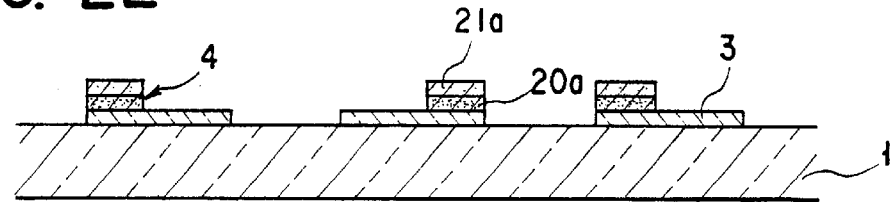

In the formation of the bus electrodes, first, the photo-curable, electrically conductive composition containing black conductive fine particles as mentioned hereinbefore is applied on a front glass substrate 1 having transparent electrodes 3 of ITO or SnO$_2$ formed thereon in advance by such a heretofore known suitable method as sputtering, ion plating, chemical vapor deposition and electrode position, as illustrated in FIG. 2A, and the applied layer is dried to produce an electrically conductive black lower layer 20 exhibiting good tack-free touch of finger. Then, as shown in FIG. 2B, a composition of the same formulation as the photo-curable, electrically conductive composition mentioned above except that the black conductive fine particles are replaced by the conductive powder of Ag, Au, Al, Pt, Pd, etc. mentioned above is applied to the substrate and the applied layer is dried to produce an electrically conductive white upper layer 21 exhibiting good tack-free touch of finger. Thereafter, a photomask 22 containing a prescribed exposure pattern is superposed on the upper layer 21, as shown in FIG. 2C, and the layers are exposed to light. Then, the exposed layers are developed with an aqueous alkaline solution to remove the unexposed portions and assume the prescribed electrode pattern as shown in FIG. 2D. Thereafter, by calcining the layers, the bus electrodes each consisting of the lower layer (black) electrode 20a and the upper layer (white) electrode 21a are formed on the transparent electrode 3 as shown in FIG. 2E.

When the dry films of the electrically conductive black composition and the electrically conductive white composition respectively prepared in advance in the form of film are used, they may be sequentially laminated onto the front glass substrate under application of heat and pressure and subjected to each of components steps of exposure to light, development, and calcination. Alternatively, it is possible to adopt a method such that the lower layer (black) electrodes are formed by applying the photo-curable, electrically conductive composition mentioned above to the front glass substrate, drying the layer, exposing the layer to light, developing and calcining the exposed layer, and then the upper layer (white) electrodes are formed by applying the electrically conductive white composition to the substrate, drying the layer, exposing the layer to light, developing and calcining the exposed layer.

EXAMPLES

Now, the present invention will be described more specifically below with reference to examples and comparative examples. As a matter of course, the present invention is not limited to the following examples. Wherever "parts" and "%" are mentioned hereinbelow, they invariably refer to those based on weight unless otherwise specified.

Synthesis Example 1

Into a flask equipped with a thermometer, a stirrer, a dropping funnel, and a reflux condenser, methyl methacrylate and methacrylic acid were charged in a molar ratio of 0.76:0.24 and dipropylene glycol monomethyl ether as a solvent and azobisisobutyronitrile as a catalyst were added thereto and they were together stirred under an atmosphere of nitrogen gas at 80° C. for 2–6 hours to obtain a resin solution.

The resultant resin solution was cooled and, in the presence of methyl hydrdquinone as a polymerization inhibitor and tetrabutyl phosphonium bromide as a catalyst, subjected to addition reaction of glycidyl methacrylate at a molar ratio of 0.12 mole per one mole of the carboxyl groups of the resin mentioned above under the conditions of 95–105° C. and 16 hours. The reaction product was cooled and then the resultant organic binder, A, was removed.

This resin, A, had the weight-average molecular weight of about 10,000, the acid value of 59 mg KOH/g, and the double bond equivalent weight of 950. The weight-average molecular weight of the obtained copolymer resin was determined by high-speed liquid chromatography using a pump, "LC-6AD" produced by Shimadzu Seisakusho Ltd., connected to three columns, "Shodex" (registered trademark) KF-804, KF-803, and KF-802 produced by Showa Denko K.K.

Synthesis Example 2

An organic binder, B, was prepared by following the procedures of Synthesis Example 1, except that the molar ratio of methyl methacrylate and methacrylic acid charged into the flask was set at 0.87:0.13 and that the resultant resin was not subjected to the addition reaction of glycidyl methacrylate.

This resin, B, had the weight-average molecular weight of about 10,000 and the acid value of 74 mg KOH/g.

The organic binder, A or B, obtained as mentioned above was compounded with other components at the ratios indicated below, stirred by a stirrer, and kneaded with a three-roll mill to be transformed into a pasty constitution.

The used low-melting glass powder was glass frit obtained by grinding a glass composition containing 60% of PbO, 20% of $B_2O_3$, 15% of $SiO_2$, and 5% of $Al_2O_3$ and having a thermal expansion coefficient, $\alpha_{300}$, of $70 \times 10^{-7}/°$ C., a glass transition point of 445° C., and an average particle diameter of 1.6 μm adjusted by grinding.

Electrically Conductive Paste for Upper Layer (White)

| | |
|---|---:|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Silver powder | 450.0 parts |
| Low-melting glass powder | 22.0 parts |
| Phosphate | 1.0 part |

Electrically Conductive Paste for Lower Layer (Black);

Composition Example 1

| | |
|---|---:|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Ruthenium oxide ($RuO_2$, specific surface area: 50.5 $m^2$/g) | 20.0 parts |

Composition Example 2

| | |
|---|---:|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Ruthenium oxide ($RuO_2$, specific surface area: 35.0 $m^2$/g) | 20.0 parts |

Composition Example 3

| | |
|---|---:|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Ruthenium oxide ($RuO_2$, specific surface area: 20.5 $m^2$/g) | 20.0 parts |

Composition Example 4

| | |
|---|---|
| Organic binder B | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Ruthenium oxide ($RuO_2$, specific surface area: 50.5 $m^2/g$) | 20.0 parts |

Composition Example 5

| | |
|---|---|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Ruthenium oxide ($RuO_2$, specific surface area: 50.5 $m^2/g$) | 20.0 parts |
| Synthetic amorphous silica powder (product of Nippon Aerosil K.K., AEROSIL 200; average particle diameter of primary particles: 12 nm, specific surface area determined by BET method: 200 ± 25 $m^2/g$) | 10.0 parts |
| Low-melting glass powder | 20.0 parts |
| Phosphate | 1.0 part |

Composition Example 6

| | |
|---|---|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Copper-iron-based black composite oxide ($CuO-Fe_2O_3-Mn_2O_3$, specific surface area: 28.4 $m^2/g$) | 20.0 parts |
| Hypophosphorous acid | 1.0 part |

Comparative Composition Example 1

| | |
|---|---|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Ruthenium oxide ($RuO_2$, specific surface area: 17.0 $m^2/g$) | 20.0 parts |

Comparative Composition Example 2

| | |
|---|---|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Ruthenium oxide ($RuO_2$, specific surface area: 3.5 $m^2/g$) | 20.0 parts |

Comparative Composition Example 3

| | |
|---|---|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Silver powder | 100.0 parts |
| Heat-resistant black pigment | 100.0 parts |
| Synthetic amorphous silica powder (product of Nippon Aerosil K.K., AEROSIL 200; average particle diameter of primary particles: 12 nm, specific surface area determined by BET method: 200 ± 25 $m^2/g$) | 10.0 parts |
| Low-melting glass powder | 20.0 parts |
| Phosphate | 1.0 part |

Comparative Composition Example 4

| | |
|---|---|
| Organic binder A | 100.0 parts |
| Pentaerythritol triacrylate | 50.0 parts |
| 2-Benzyl-2-dimethylamino-1-(4-morpholinophenyl)-butan-1-one | 5.0 parts |
| Dipropylene glycol monomethyl ether | 80.0 parts |
| Copper-iron-based black composite oxide ($CuO-Fe_2O_3-Mn_2O_3$, specific surface area: 6.7 $m^2/g$) | 20.0 parts |
| Hypophosphorous acid | 1.0 part |

Each paste of the composition examples 1 to 6 and comparative composition examples 1 to 4 obtained as described above was evaluated for blackness and conductivity between the layers. The evaluation methods are as follows:

Blackness:

The paste to be evaluated (electrically conductive paste for lower layer) was applied to the top face of a glass substrate throughout the whole area by the use of a 300-mesh polyester screen. Then, the applied layer was dried in a hot air circulating drying oven at 90° C. for 20 minutes to give a film of good tack-free touch. Next, the electrically conductive paste for upper layer (white) was applied to the top face of this film throughout the whole area by the use of a 200-mesh polyester screen. Then, the applied layer was dried in a hot air circulating drying oven at 90° C. for 20 minutes to give a two-layer film of good tack-free touch. Thereafter, by using a metal halide lamp as a light source, the whole surface of the film was exposed to light till a calculated dose of 500 mJ/$cm^2$ on the composition. Then, the exposed film was developed with an aqueous. 1 wt. % $Na_2CO_3$ solution of 30° C. and washed with water. Finally, the substrate manufactured under the foregoing conditions was heated at a temperature increasing rate of 5° C./minute and calcined at 550° C. for 30 minutes in the air to obtain the test substrate. The color tone of color indication system L*a*b* assumed by the calcined film thus obtained was determined by means of a differential colorimeter (Model CR-221, made by Minolta Camera Co., Ltd.) in accordance with JIS-Z-8729 and the blackness was rated by the L* value that is the psychometric lightness. The blackness of the film is deep in proportion as this L* value is small.

Conductivity Between the Layers:

The paste to be evaluated (electrically conductive paste for lower layer) was applied to the top face of a glass substrate having electrodes 100 μm in width formed thereon in advance throughout the whole area by the use of a 300-mesh polyester screen. Then, the applied layer was dried in a hot air circulating drying oven at 90° C. for 20 minutes to give a film of good tack-free touch. Next, the electrically conductive paste for upper layer (white) was applied to the top face of this film throughout the whole area by the use of a 200-mesh polyester screen. Then, the applied layer was dried in a hot air circulating drying oven at 90° C. for 20 minutes to give a two-layer film of good tack-free touch. Thereafter, by using a negative film adapted to form lines 100 μm in width perpendicular to the electrodes having the width of 100 μm mentioned above and a metal halide lamp as a light source, the whole surface of the film was exposed to light till a calculated dose of 500 mJ/cm² on the composition. Then, the exposed film was developed with an aqueous 1 wt. % $Na_2CO_3$ solution of 30° C. and washed with water. Finally, the substrate manufactured under the foregoing conditions was heated at a temperature increasing rate of 5° C./minute and calcined at 550° C. for 30 minutes in the air to obtain the test substrate. The resistance between the white layer of the black-white two-layer electrodes obtained as described above and the electrode having the width of 100 μm mentioned above was determined. The conductivity between two layers was rated by assuming the determined value to be the resistance of the black layer.

The results of rating of these properties are shown in Table 1.

black layer of the bus electrode of the PDP satisfying both the sufficient conductivity between layers and blackness after calcination, without deteriorating the excellent adhesiveness to a substrate, resolution, and calcination properties of the composition in the component steps of process, i.e. drying, exposure to light, development, and calcinations.

What is claimed is:

1. A photo-curable, electrically conductive composition, comprising (A) electrically conductive black particles having a specific surface area of more than 20 m²/g and not more than 100 m²/g, said electrically conductive black particles being at least one species selected from the group consisting of ruthenium oxides, ruthenium compounds, $CuO—Cr_2O_3$, $CuO—Cr_2O_3—Mn_2O_3$, $CuO—Fe_2O_3$, $CuO—Fe_2O_3—Mn_2O_3$, and $CuO—Fe_2O_3—Mn_2O_3—Al_2O_3$, (B) a carboxyl group-containing resin as an organic binder, (C) a photopolymerizable monomer having a (meth)acryloyl group in its molecule, and (D) a photopolymerization initiator.

2. The composition set forth in claim 1, further comprising (E) inorganic particles.

3. The composition set forth in claim 1 or 2, which contains said electrically conductive black particles (A) in an amount of 0.1 to 100 parts by weight, based on 100 parts by weight of the organic binder (B).

TABLE 1

| Properties | Composition examples | | | | | | Comp. Composition examples | | | |
|---|---|---|---|---|---|---|---|---|---|---|
|  | 1 | 2 | 3 | 4 | 5 | 6 | 1 | 2 | 3 | 4 |
| Blackness (L* value) | 5.2 | 5.9 | 6.7 | 5.3 | 5.4 | 5.3 | 9.6 | 14.1 | 12.5 | 12.4 |
| Resistance (Ω) | 0.38 | 0.42 | 0.45 | 0.35 | 0.37 | 0.52 | 0.57 | 0.82 | 1.7 | 1.3 |

It is clearly noted from the results shown in Table 1 that the electrically conductive film obtained by using the paste of the composition according to the present invention is excellent in both the blackness and the conductivity between layers in comparison with that obtained by using the paste of the comparative composition.

Further, the aforementioned paste to be evaluated was rated for the line shape after development, the line shape after calcination, and the adhesiveness and had no problem in these properties. The evaluation was carried out by following the method for evaluation of blackness described above except that the two-layer film formed on the glass substrate was exposed to light according to a prescribed pattern by using a negative film adapted to form a line/space of 56/100 μm, then developed with an aqueous 1 wt. % $Na_2CO_3$ solution of 30° C., washed with water, and then calcined to obtain the substrate having the calcined pattern. With respect to the rating criteria, the line shape after development was evaluated by observing through a microscope the pattern which had undergone development to find the presence of uneven line width and the warp of line, and the line shape after calcination was evaluated by observing through a microscope the pattern which had undergone calcination to find the presence of uneven line width and the warp of line. The adhesiveness was evaluated by using a cellophane adhesive tape to find whether it causes the peeling of pattern or not.

INDUSTRIAL APPLICABILITY

By using the photo-curable, electrically conductive composition of the present invention, it is possible to form the 4. The composition set forth in claim 1 or 2, wherein said organic binder (B) is a resin containing a carboxyl group and having a weight-average molecular weight in the range of 1,000 to 100,000 and an acid value in the range of 20 to 150 mg KOH/g.

5. The composition set forth in claim 5, wherein said resin is at least one resin having a carboxyl group selected from the group consisting of:
 (i) a carboxyl group-containing resin obtained by the copolymerization of an unsaturated carboxylic acid and a compound having an unsaturated double bond,
 (ii) a carboxyl group-containing resin obtained by the reaction of an organic acid having one carboxylic group and no ethylenically unsaturated bond in its molecule with a glycidyl group of a copolymer of an unsaturated double bond-containing compound and glycidyl (meth)acrylate, and the subsequent reaction of a polybasic acid anhydride with a secondary hydroxyl group of a product of the above reaction, and
 (iii) a carboxyl group-containing resin obtained by the reaction of a polybasic acid anhydride with a hydroxyl group-containing polymer.

6. The composition set forth in claim 1 or 2, wherein said organic, binder (B) is a photosensitive resin containing a carboxyl group and an ethylenically unsaturated double bond and having a weight-average molecular weight in the range of 1,000 to 100,000, an acid value in the range of 20 to 150 mg KOH/g, and a double bond equivalent weight in the range of 350 to 2,000.

7. The composition set forth in claim 6, wherein said resin is at least one photosensitive resin having a carboxyl group selected from the group consisting of:

(i) a carboxyl group-containing photosensitive resin obtained by adding an ethylenically unsaturated double bond as a pendant group to a copolymer of an unsaturated carboxylic acid and a compound having an unsaturated double bond, (ii) a carboxyl group-containing photosensitive resin obtained by the reaction of an unsaturated carboxylic acid with a copolymer of a compound having a glycidyl group and an unsaturated double bond and a compound having an unsaturated double bond, and the subsequent reaction of a polybasic acid anhydride with a secondary hydroxyl group of a product of the above reaction, (iii) a carboxyl group-containing photosensitive resin obtained by the reaction of a compound having a hydroxyl group and an unsaturated double bond with a copolymer of an acid anhydride having an unsaturated double bond and a compound having an unsaturated double bond, (iv) a carboxyl group-containing photosensitive resin obtained by the reaction of an epoxy compound with an unsaturated monocarboxylic acid, and the subsequent reaction of a polybasic acid anhydride with a secondary hydroxyl group of a product of the above reaction, and (v) a carboxyl group-containing photosensitive resin obtained by the reaction of a polybasic acid anhydride with a hydroxyl group-containing polymer thereby obtaining a carboxyl group-containing resin, and the subsequent reaction of a compound having a glycidyl group and an unsaturated double bond with the resultant carboxyl group-containing resin.

8. The composition set forth in claim 2, wherein said inorganic particles (E) are at least one powder selected from the group consisting of a glass powder having a softening point of 400 to 600° C., a conductive powder, a heat-resistant black pigment, and a silica powder.

9. The composition set forth in claim 8, further comprising at least one acid selected from the group consisting of inorganic acids, organic acids, and phosphoric acid compounds, as a stabilizer.

10. The composition set forth in claim 1 or 2, which contains said photopolymerizable monomer (C) in an amount of 20 to 100 parts by weight, based on 100 parts by weight of the organic binder (B).

11. The composition set forth in claim 1 or 2, which contains said photopolymerization initiator (D) in an amount of 1 to 30 parts by weight, based on 100 parts by weight of the organic binder (B).

12. The composition set forth in claim 1 or 2, which is formed in the form of film.

13. A plasma display panel provided with a front substrate having an electrode circuit formed from a calcined product of a photo-curable, electrically conductive composition set forth in claim 1 or 2.

* * * * *

UNITED STATES PATENT AND TRADEMARK OFFICE
CERTIFICATE OF CORRECTION

PATENT NO.     : 6,555,594 B1
DATED          : April 29, 2003
INVENTOR(S)    : Fukushima et al.

It is certified that error appears in the above-identified patent and that said Letters Patent is hereby corrected as shown below:

<u>Title page,</u>
Item [57], ABSTRACT,
Line 9, "anorganic" should read -- an organic --.

Signed and Sealed this

Fifteenth Day of July, 2003

JAMES E. ROGAN
*Director of the United States Patent and Trademark Office*